United States Patent
Huang

(10) Patent No.: US 10,210,912 B2
(45) Date of Patent: Feb. 19, 2019

(54) INTEGRATED THERMOELECTRIC COOLER FOR THREE-DIMENSIONAL STACKED DRAM AND TEMPERATURE-INVERTED CORES

(71) Applicant: Advanced Micro Devices, Inc., Sunnyvale, CA (US)

(72) Inventor: Wei Huang, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/618,349

(22) Filed: Jun. 9, 2017

(65) Prior Publication Data

US 2018/0358080 A1    Dec. 13, 2018

(51) Int. Cl.
| | |
|---|---|
| *G11C 7/04* | (2006.01) |
| *H01L 27/108* | (2006.01) |
| *H01L 23/38* | (2006.01) |
| *H01L 35/32* | (2006.01) |
| *H01L 27/16* | (2006.01) |

(52) U.S. Cl.
CPC ........... *G11C 7/04* (2013.01); *H01L 23/38* (2013.01); *H01L 27/10897* (2013.01); *H01L 27/16* (2013.01); *H01L 35/32* (2013.01)

(58) Field of Classification Search
CPC ........... G11C 7/04; H01L 35/32; H01L 27/16; H01L 23/38; H01L 27/10897
See application file for complete search history.

(56) References Cited

U.S. PATENT DOCUMENTS

| | | | |
|---|---|---|---|
| 7,893,529 B2* | 2/2011 | Hsu | H01L 23/481 |
| | | | 136/203 |
| 8,868,962 B2 | 10/2014 | Myers et al. | |
| 2006/0262818 A1 | 11/2006 | Kumar et al. | |
| 2012/0096871 A1* | 4/2012 | Wang | F25B 21/02 |
| | | | 62/3.2 |
| 2013/0202008 A1* | 8/2013 | Myers | G01K 7/346 |
| | | | 374/1 |
| 2015/0094875 A1* | 4/2015 | Duzly | G05D 23/1919 |
| | | | 700/300 |
| 2015/0179543 A1* | 6/2015 | Tan | H01L 23/38 |
| | | | 62/3.7 |

OTHER PUBLICATIONS

Parthasarathy et al. ("Energy Efficient Active Cooling of Integrated Circuits Using Autonomous Peltier/Seebeck Mode Switching of a Thermoelectric Module," 2014 Semiconductor Thermal Measurement and Management Symposium (SEMI-THERM), pp. 94-99, Mar. 2014).*

Zu, Yazhou, et al. "Ti-States: Processor Power Management in the Temperature Inversion Region." 49th Annual IEEE/ACM International Symposium on Microarchitecture (MICRO), Oct. 15-19, 2016, 13 pages.

* cited by examiner

*Primary Examiner* — Yasser A Abdelaziez

(57) ABSTRACT

Managing temperature of a semiconductor device having a temperature inverted processor core and stacked memory by operation of an integrated thermoelectric cooler. The thermoelectric cooler is operated to pump heat from a stacked memory device that requires a cool operating temperature to a temperature inverted processor core that maintains a higher operating temperature until threshold operating temperatures are achieved.

13 Claims, 3 Drawing Sheets

INTEGRATED THERMOELECTRIC COOLER FOR THREE-DIMENSIONAL STACKED DRAM AND TEMPERATURE-INVERTED CORES

BACKGROUND

Increasing the heat or operating temperature of logic circuits of an integrated circuit (chip) results in increased power consumption. Increasing the power consumption of a chip may result in internal circuit failure so higher chip temperatures are not desirable for reasons of efficiency and reliability. Shrinking chip sizes allow for increased density of circuits components and memory and increases the challenge of maintaining processors that operate at safe temperatures and higher frequencies.

BRIEF DESCRIPTION OF THE DRAWINGS

For a better understanding of the disclosure and the various implementations described herein, reference is now made to the following brief description which, taken in connection with the accompanying drawings and detailed description, show at least one exemplary implementation.

DETAILED DESCRIPTION

In the present disclosure, a thermoelectric cooler is integrated into a semiconductor chip including a 3D stacked memory coupled to a temperature-inverted logic core. A temperature-inverted core has one or more circuits that operate more efficiently as the core temperature rises. As the chip operates, the operation of the 3D stacked memory and core results in the chip temperature increasing. Memories, and in particular, 3D stacked memories, operate within a temperature range that requires strict regulation for reliable and predictable operation. During operation of the chip, sensors within the chip monitor the temperature of the 3D stacked memory and provide feedback to a processor as to whether the operating temperatures of the 3D stacked memory and core are within a desired temperature operating threshold. The processor operates the thermoelectric cooler to maintain the 3D stacked memory within a desired operating temperature range by transferring or dissipating heat from the 3D stacked memory to the temperature-inverted logic core. Because of the temperature-inverted characteristics of the core, transferring heat from the 3D stacked memory to the core can improve reliability of the memory by reducing its temperature and increase the frequency of the core by increasing its temperature.

Figure 1:
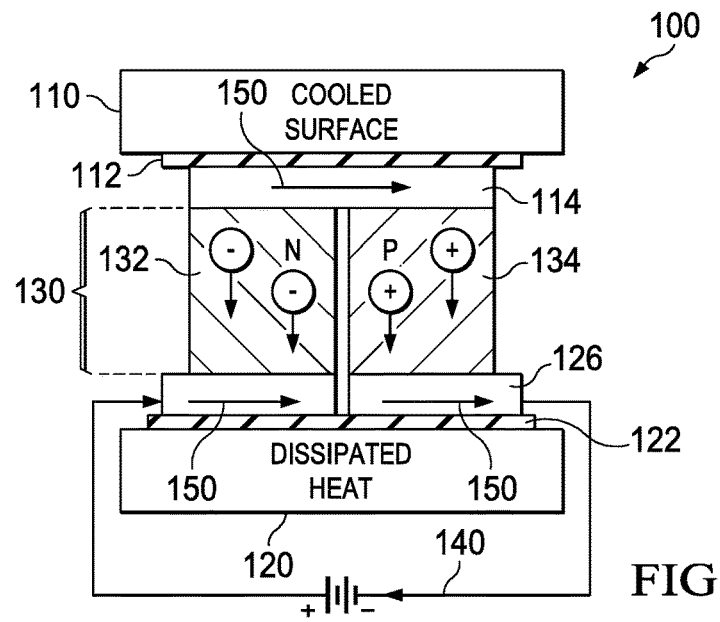
FIG. 1 illustrates a block diagram of the operation of an exemplary cooling system in accordance with an illustrative implementation of the disclosure.

Turning to FIG. 1, a block diagram illustrates the operation of an exemplary thermoelectric cooling system in accordance with an illustrative implementation of the disclosure. As depicted, cooling system 100 illustrates a cooled surface 110, a dissipated heat 120 section, and a thermoelectric cooler (TEC) 130. TEC 130 separates the cooled surface 110 from the dissipated heat 120 section of the semiconductor chip.

TEC 130 consists of multiple pairs of N type 132 and P type 134 semiconductors connected electrically in series and thermally in parallel to form a cool junction 114 and a hot junction 126. Insulator layers 112 and 122 provide electric insulation and couple the cool surface 110 and the dissipated heat 120 section to the TEC 130 through cool junction 114 and hot junction 126. In operation, as electrons flow in the N- type region from the negative to the positive terminals of the power supply and the holes flow from the positive to the negative terminal in the P-type region, a power source 140 applied to the junction 126 causes current to be transferred in the direction of the current flow 150 resulting in heat being transferred from the cooled surface 110 to the dissipated heat 120 section. The TEC 130 implementation may be characterized as operating according to a Peltier effect. The Peltier effect refers to a phenomenon where a current flowing through a circuit of two dissimilar materials causes heat to be extracted from a cold semiconductor junction and transferred to a hot semiconductor junction. The materials may include thermoelectric materials such as, P-type polysilicon, N-type polysilicon, polysilicon-germanium, bismuth telluride, and the like. As described further herein, in some implementations, one or more instances of the TEC 130 are employed to selectively transfer heat between different portions of a semiconductor device. For example, in an implementation, instances of the TEC 130 are employed to transfer heat between a memory and logic core layers.

Figure 2:
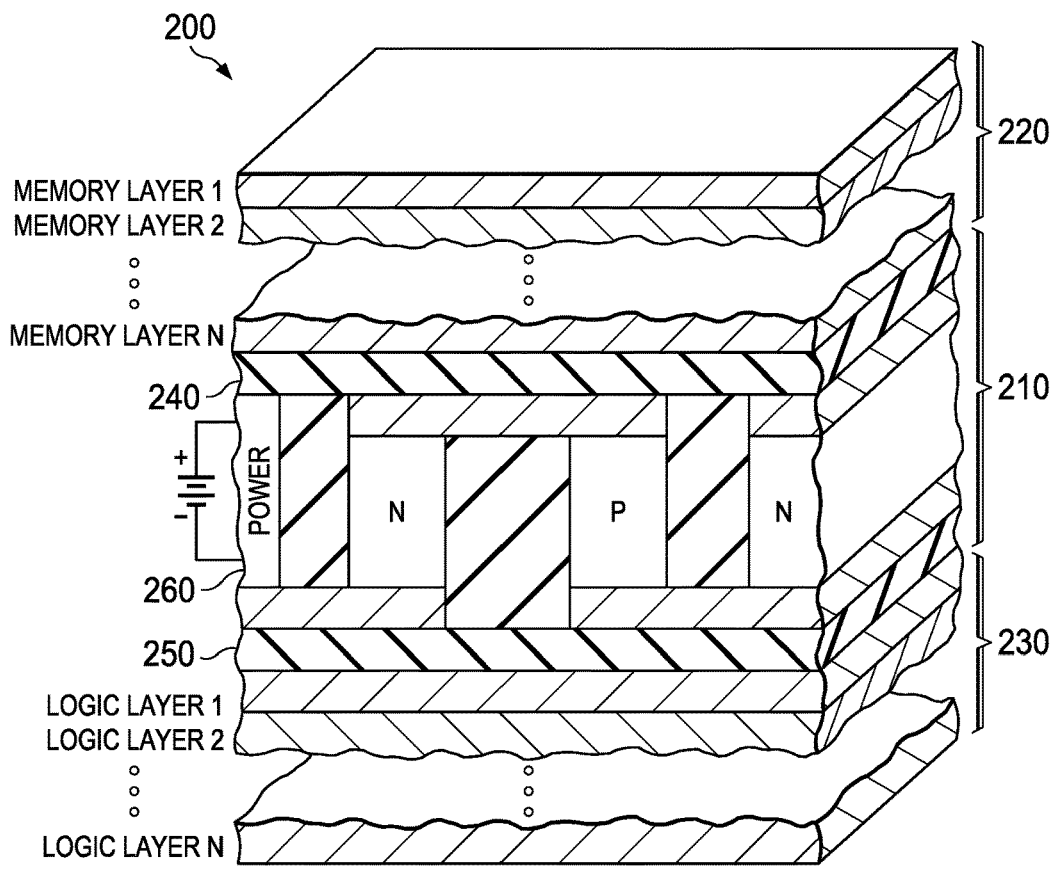
FIG. 2 illustrates a semiconductor device comprising a three-dimensional (3D) stacked memory and logic core in accordance with an illustrative implementation of the disclosure.

FIG. 2 illustrates a semiconductor device 200 including a stacked memory and logic core in accordance with an illustrative implementation of the disclosure. Semiconductor device 200 comprises TEC 210 sandwiched between a plurality of stacked memory layers 220 and a plurality of semiconductor logic core layers 230. In this disclosure, the terms logic core, logic core layers and logic layers are used interchangeably in this disclosure.

In an implementation, stacked memory layers 220 is a 3D stacked memory that represent a cooled surface such as cooled surface 110 of FIG. 1. Logic layers 230 represent a dissipated heat section such as dissipated heat 120 section of FIG. 1. TEC 210 includes a cold junction 240 adjacent to the stacked memory layers 220 and a hot junction 250 adjacent to the logic layers 230 on the opposing end of the TEC 210. In an implementation, logic layers 230 are temperature-inverted logic layers, such that performance of the logic layers 230 improve as the temperature of the logic layers 230 is increased.

In operation, the power source 260 causes current to flow through the TEC 210 and heat is absorbed from the stacked memory layers 220 at the cold junction 240 and pumped or transferred to the hot junction 250 adjacent to the logic layers 230. Thus, the logic layers 230 increase in temperature.

Typically, an increase in the temperature of the logic circuitry would result in reduced performance. As temperature of logic circuitry increases, operating speed and frequency decreases and the circuitry burns more power. However, temperature-inverted circuits respond differently to increases in temperature. As improved process technologies are enabling shrinking feature and transistor sizes, it has been noted that these smaller circuits exhibit increases in switching speed and frequency with increases in operating temperature. This phenomenon, wherein an increase in the operating temperature of a circuit causes a corresponding increase in the switching speed or frequency of the circuit, is known as temperature inversion. Temperature inversion is particularly applicable in technologies subject to processes that produce small or miniature transistor sizes. Temperature inversion depends on the threshold voltage of the transistor, the gate voltage applied to the transistors, and transistor configuration.

Returning to FIG. 2, as heat is dissipated into logic layers 230 through hot junction 250, the increased temperature of logic layers 230 result in an increased propagation speed and frequency without increasing power. Thus, the performance of the logic core layers 230 will be enhanced rather than negatively impacted by increasing the temperature.

Figure 3:
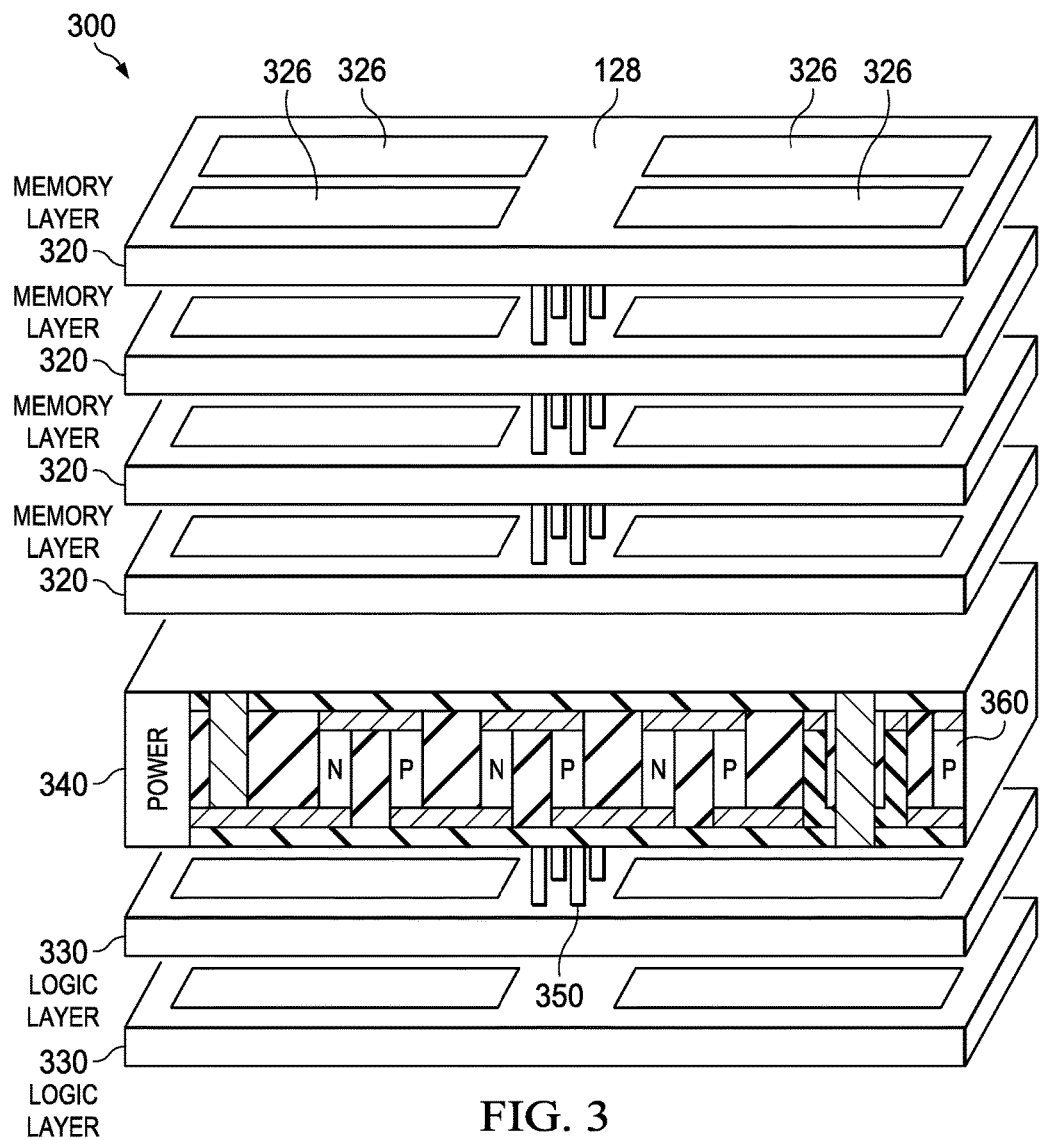
FIG. 3 illustrates a detailed diagram of FIG. 2 in accordance with an illustrative implementation of the disclosure.

FIG. 3 illustrates a detailed diagram of FIG. 2 in accordance with an illustrative implementation of the disclosure. As illustrated, semiconductor device 300 includes a plurality of memory layers 320, a plurality of logic layers 330, and TEC 360. Memory layers 320 include one or more temperature sensors 326 integrated into the semiconductor substrate. Vias, such as through-silicon vias (TSVs) 350 extend through semiconductor substrate to couple memory layers 320 to the plurality of logic layers 330.

In an implementation, memory layers 320 represent a 3D-stacked dynamic random-access memory (DRAM) such as a high-bandwidth memory. The logic layers 330 are temperature-inverted circuitry. In order for the memory to operate reliably and efficiently, operating temperature guidelines must be followed. For example, a 3D stacked DRAM requires operating temperatures to remain about 85° C. (185° F.) for reliable operation. As the semiconductor device 300 operates, temperature sensors 320 keep track of the temperature of the memory layers 320. TEC 360 operates to maintain memory layers 320 at its reliable operating temperature of about 85° C. by pumping heat from the memory layers 320 to logic layers 330.

One or more heat or thermal sensors may also be located in the plurality of logic layers 330. As the logic layers 330 absorb the heat that is transferred from memory layers 320 through application of power 340 to TEC 360, the thermal sensors 326 track or monitor the increase in heat to make sure that the logic layers do not become overheated. In particular, as described further herein, in an implementation, if the thermal sensors 326 detect that the sensed temperature rises above a specified threshold, a control module (not shown at FIG. 3) adjusts one or more operating parameters of the semiconductor device 300, including one or more of: reducing a clock speed that synchronizes logic components of the semiconductor device 300, reducing power applied to one or more modules of the semiconductor device 300, activating additional TECs in semiconductor device 300, and the like, or a combination thereof.

Figure 4:
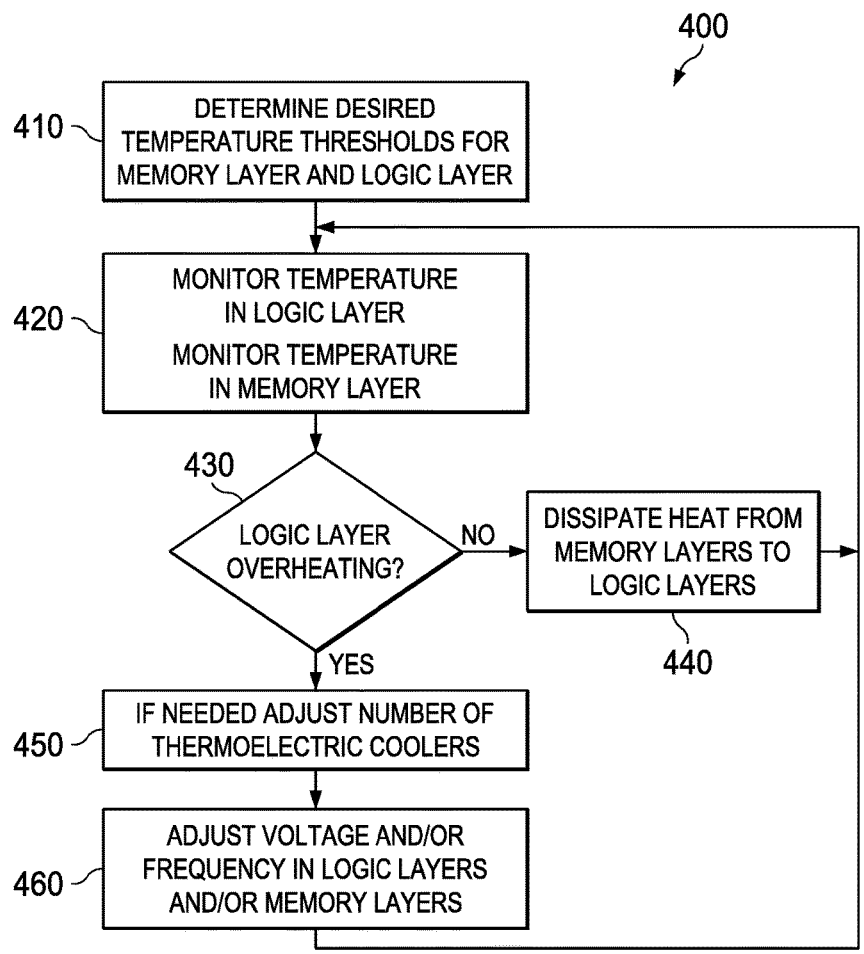
FIG. 4 illustrates a flowchart of a method of thermal management in accordance with an implementation of the disclosure.

Turning now to FIG. 4, flowchart 400 illustrates a method of thermal management in accordance with an implementation of the disclosure, such as the implementation disclosed by semiconductor device 300 of FIG. 3. The method includes determining at 410 desired temperature thresholds for a plurality of memory layers and logic layer. The temperature threshold indicates the maximum operating temperature at which the memory circuits and logic circuits may safely operate. For example, a 3D stacked DRAM memory circuit has a temperature threshold of 85° C. In an implementation, the temperature threshold of a 3D stacked DRAM memory circuit operating in a device is less than or cooler than the temperature threshold of the temperature-inverted circuitry of the logic layers.

As semiconductor device 300 operates, the power increases and the temperature of the device increases. At 420, thermal sensors located in the substrate of the memory layers and the logic layers monitor the temperature of the logic layers and monitor the temperature of the memory layers. The TEC ensures that the temperature of the memory layers do not exceed operating temperature by dissipating heat into the temperature-inverted logic layers.

The thermal sensors also keep track of whether or not the temperature inverted logic layers exceed a predefined temperature threshold beyond which safe operation may not be possible. At 430, it is determined whether or not the logic layer is overheating based on temperature feedback from the thermal sensor. If the thermal sensors indicate that the temperature of the logic layers do not exceed the predefined temperature threshold for the logic layers, then device operation continues with the TEC dissipating heat from the memory layers into the temperature-inverted logic layers at 440 and monitoring the temperature in the logic layers and memory layers at 420.

If the thermal sensors indicate that the temperature of the logic layers exceed the predefined temperature threshold for the temperature-inverted logic layers, it is possible, at 450, to adjust the number of TECs to achieve the desired temperatures in the memory layers and temperature-inverted logic layers, if needed. The one or more TECs in the logic layers and memory layers are controlled by digital switches or some other type of controller or switching device. Individual TECs are turned on and off within the logic layers and/or memory layers depending whether a predefined temperature threshold is exceeded in each respective layer.

At 460, in some embodiments the level of overheating is reduced by adjusting the voltage applied to the TEC to reduce the rate of heat transfer from the memory layers to the logic layers. In an implementation, an external controller connected to the TECs is configured to turn on or turn off individual TECs until a desired temperature is achieved in the memory layers. In an implementation, the frequency of transistor switching in the memory layers and/or logic layers is also adjusted until a desired temperature is achieved.

Figure 5:
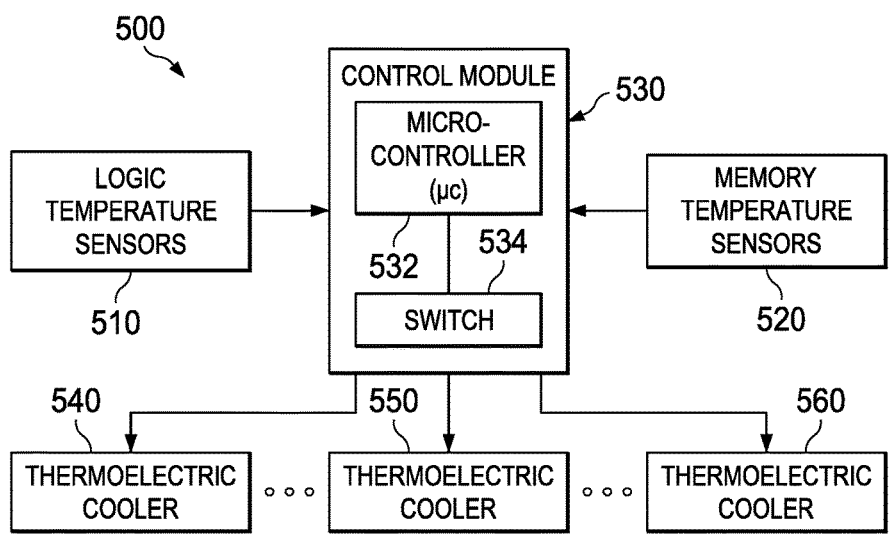
FIG. 5 illustrates a system for thermoelectric cooler control in accordance with an illustrative implementation of the disclosure.

In FIG. 5, system 500 illustrates an implementation of thermoelectric cooler control in accordance with an illustrative implementation of the disclosure. In the illustrated example, logic temperature sensors 510 are positioned at various locations within the logic layers of a stacked DRAM, such as logic layers 230 of FIG. 2. Memory temperature sensors 520 are positioned at various locations within the stacked memory layers of a stacked DRAM, such as stacked memory layers 220 of FIG. 2. Logic temperature sensors 510 and memory temperature sensors 520 are coupled to control module 530. Control module 530 includes a microcontroller 532 that can be configured through microcode or application software. Control module 530 can also include switch 534 that, in an implementation, is coupled to microcontroller 532 and a number of thermoelectric coolers (TECs), such as thermoelectric cooler 540, thermoelectric cooler 550 and thermoelectric cooler 560, connected in parallel. The number of thermoelectric coolers vary depending on the desired application.

In operation, the microcontroller 532 may be programmed with temperature threshold values for the logic layers and the stacked memory layers which should not be exceeded for safe operation. Logic temperature sensors 510 and memory temperature sensors 520 monitor the operating temperatures of the stacked memory and the logic core. In response to the operating temperatures being less than or greater than the programmed temperature thresholds, the microcontroller 532 operates a switch 534 to turn on or off one or more the TECs 540, 550, and 560 and/or other until a desired temperature for the memory and/or the core is reached.

Thus, in an implementation, in response to the memory temperature sensors indicating that the sensed temperature is above a first programmed temperature threshold, the microcontroller 532 enables switch 534 to activate the thermoelectric cooler 540, while maintaining the TECs 550 and 560 in inactive states. In response to the memory temperature sensors indicating that the sensed temperature is above a second programmed temperature threshold, higher than the first threshold, the microcontroller 532 enables switch 534 to activate the thermoelectric cooler 550, maintain the thermoelectric cooler 540 in the active state, and maintain the thermoelectric cooler 560 in the inactive state. In response to the sensed temperature at the stacked memory falling below the second threshold, the microcontroller 532 deactivates the thermoelectric cooler 550 but maintains the thermoelectric cooler 540 in the active state. Thus, the microcontroller 532 can respond to changes in temperature by selectively activating and deactivating different ones of the TECs 540, 550, and 560 in order to keep both the memory and the logic layers within respective temperature ranges.

The illustration of the TEC control in FIG. 5 is not meant to imply physical or architectural limitations to the manner in which different advantageous implementations may be implemented. Other components in addition and/or in place of the ones illustrated may be used. Some components may be unnecessary in some advantageous implementations. Also, the blocks are intended to illustrate functional components. One or more of these blocks may be combined and/or divided into different blocks when implemented in different advantageous implementations.

In some embodiments, the apparatus and techniques described above are implemented in a system comprising one or more integrated circuit (IC) devices (also referred to as integrated circuit packages or microchips), such as the 3D stacked DRAM and temperature-inverted logic layers as described above with reference to FIGS. 1-5. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

For example, in one implementation, a runtime management routine may be implemented to read the temperatures recorded by the thermal sensors and adjust the voltage applied to the TECs and optionally, adjust the number of coolers to achieve desired, predetermined temperatures in the memory layers and logic layers.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. For example, in one implementation, the disclosure may be modified to include optical communication circuitry which has temperature sensitive layers instead of the 3D stacked DRAM. Additionally, in addition to operating the TECs with the temperature sensors, the cooling mechanism of the memory layers could involve reducing the operating frequency of the 3D stacked DRAM and/or increasing the DRAM self-refresh rate.

Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A semiconductor device, comprising:
   a three-dimensional (3D) stacked memory;
   one or more logic core layers that are temperature-inverted coupled to the three-dimensional stacked memory; and
   a thermoelectric cooler coupled between the three-dimensional stacked memory and the one or more logic core layers, wherein the thermoelectric cooler is configured to pump heat from the three-dimensional stacked memory to the one or more logic core layers.

2. The semiconductor device of claim 1, further comprising one or more thermal sensors integrated within the 3D stacked memory and the one or more logic core layers.

3. The semiconductor device of claim 1, wherein the 3D stacked memory operates at a first temperature, the one or more logic core layers operates at a second temperature, and the first temperature is cooler than the second temperature.

4. A semiconductor device, comprising:
   one or more logic core layers;
   a plurality of memory layers stacked together and coupled to the one or more logic core layers that are temperature-inverted; and
   a thermoelectric cooler integrated between the one or more logic core layers and the plurality of memory layers, wherein the thermoelectric cooler is configured to pump heat from the plurality of memory layers to the one or more logic core layers, wherein the plurality of memory layers maintains a constant cool temperature.

5. The semiconductor device of claim 4, wherein a first surface of the thermoelectric cooler couples to a cold junction and a second surface of the thermoelectric cooler couples to a hot junction.

6. The semiconductor device of claim 5, wherein the cold junction comprises the plurality of memory layers and the hot junction comprises the one or more logic core layers.

7. The semiconductor device of claim 4, further comprising:
   a first thermal sensor situated within the one or more logic core layers; and
   a second thermal sensor situated within the plurality of memory layers.

8. The semiconductor device of claim 7, further comprising:
   a temperature aware controller operative to monitor the first thermal sensor and the second thermal sensor.

9. The semiconductor device of claim 8, wherein the temperature aware controller is further operative to execute a runtime thermal management scheme that controls the first thermal sensor and the second thermal sensor.

10. The semiconductor device of claim 4, wherein the plurality of memory layers is a three-dimensional stacked memory.

11. The semiconductor device of claim 10, wherein the three-dimensional stacked memory is a dynamic random-access memory (DRAM).

12. The semiconductor device of claim 10, wherein the three-dimensional stacked memory is a high bandwidth memory.

13. The semiconductor device of claim 10, wherein the three-dimensional stacked memory and the one or more logic core layers are associated with a multi-chip module.

* * * * *